United States Patent [19]
Alberty

[11] Patent Number: 5,642,385
[45] Date of Patent: Jun. 24, 1997

[54] FREQUENCY DETECTOR FOR CARRIER FREQUENCY SYNCHRONIZATION

[76] Inventor: Thomas Alberty, Danziger Strasse 28, 71522 Backnang, Germany

[21] Appl. No.: 540,649

[22] Filed: Oct. 11, 1995

[30] Foreign Application Priority Data

Dec. 22, 1994 [DE] Germany ................. 44 45 986.61

[51] Int. Cl.$^6$ ............................. H04L 7/00; H04L 27/06
[52] U.S. Cl. ..................................... 375/354; 375/344
[58] Field of Search ................................... 395/344, 354; 455/164.1, 182.2, 192.2, 257, 260, 264; 329/302, 306–309, 323, 325, 358, 360

[56] References Cited

U.S. PATENT DOCUMENTS

| | | | |
|---|---|---|---|
| 5,031,197 | 7/1991 | Hespelt et al. | 375/354 |
| 5,157,898 | 10/1992 | Hespelt et al. | 375/354 |

FOREIGN PATENT DOCUMENTS 3707762  9/1988  Germany.

OTHER PUBLICATIONS

IEEE Transactions on Communications, vol. 37, No. 2, 1989, pp. 159–163 "A New Pattern Jitter Free Frequency Error Detector", Alberty, et al.

*Primary Examiner*—Stephen Chin
*Assistant Examiner*—Kevin Kim

[57] ABSTRACT

A frequency detector is provided for carrier frequency synchronization in a digital receiver including a frequency control circuit having a voltage-controlled oscillator (VCO), a multiplier for the received signal and the VCO signal and a device to suppress double frequency signal terms of the product signal from the multiplier. The frequency detector includes cascades of complex bandpass filters and real or complex pre-equalizers, which include bandpass filters (BP) and pre-equalizers (VE) for the real part (x) and the imaginary part (y) of the product signal, and a logic circuit which has a combining device for the cascade output signals that forms a control signal ($u_f$) for the voltage-controlled oscillator (VCO). The combining device squares or multiplies the cascade output signals to form resulting signals as a measure of power and subtracts the resulting signals from each other to produce the control signal. To improve carrier synchronization, especially in mobile radios, in particular with pattern jitter suppression in the case of offset modulation, at least two cascades, each composed of a pre-equalizer and a bandpass filter, have center frequencies having different absolute values situated in a frequency range of a single Nyquist edge of the power density spectrum of the demodulated received signal.

10 Claims, 5 Drawing Sheets

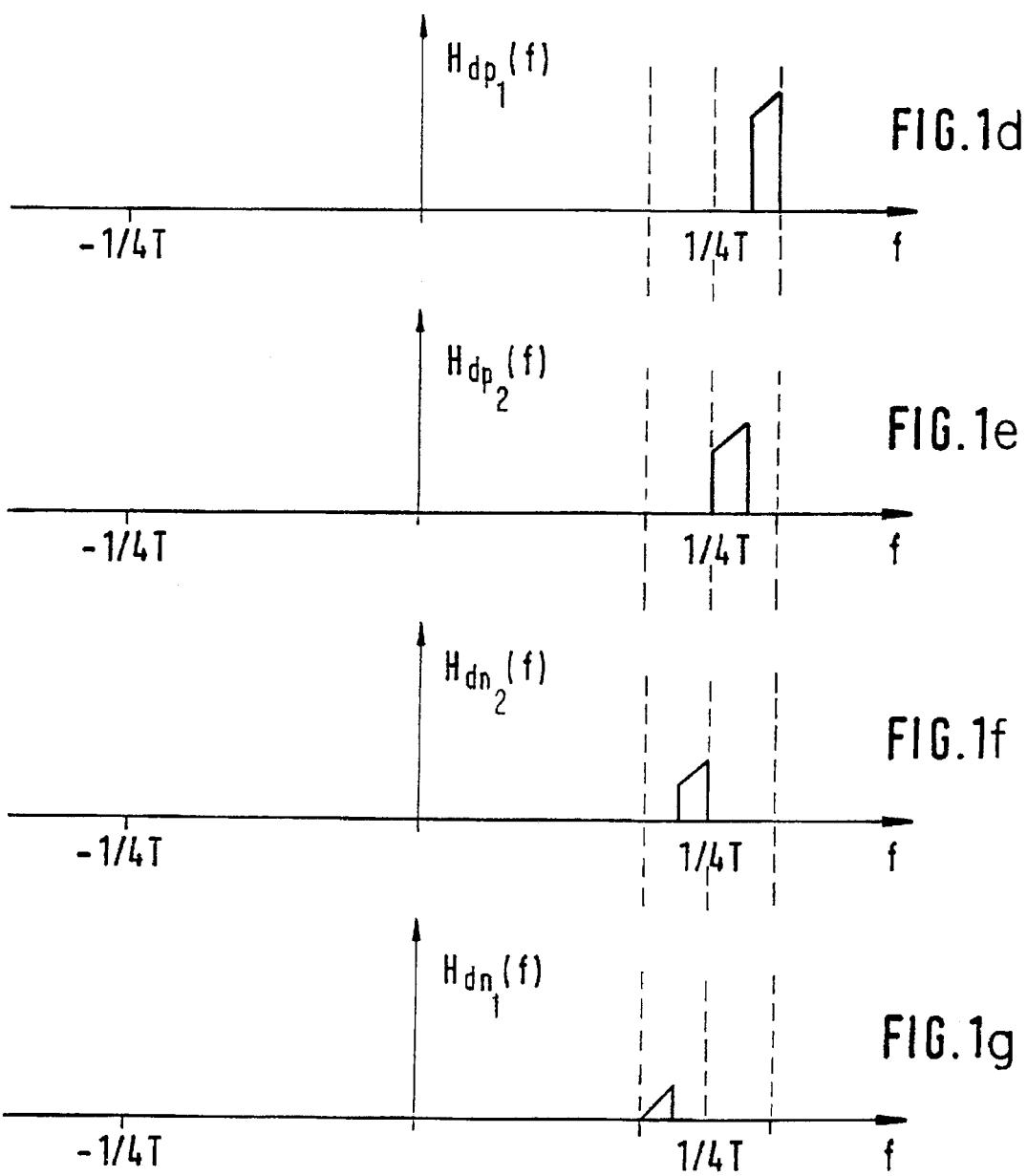

FREQUENCY DETECTOR FOR CARRIER FREQUENCY SYNCHRONIZATION

BACKGROUND OF THE INVENTION

1. Field of the Invention

The invention relates to a frequency detector for carrier frequency synchronization in receivers for digital data transmission. Such frequency detectors have been disclosed, for example by the German Patent Specification 37 07 762.

2. Description of Prior Art

A frequency detector is known for carrier frequency synchronization in a receiver of a digital data transmission, which produces a demodulated received signal including an in-phase component and a quadrature component and includes a frequency control circuit including a voltage-controlled oscillator producing a VCO signal, means for producing a product signal from the received signal and the VCO signal, the product signal consisting of a real part (x) and an imaginary part (y), means for suppressing signal terms of a double frequency of the product signal. This frequency detector comprises means for inputting the real part (x) and the imaginary part (y) of the product signal; cascades of complex bandpass filters and real or complex pre-equalizers, these cascades including means for bandpass filtering and means for pre-equalizing the real part (x) and the imaginary part (y) of the product signal to form cascade output signals and a logic circuit including means for combining the cascade output signals to form a control signal for the voltage-controlled oscillator.

The correction of the carrier frequency in the receiver is necessary in many cases in the transmission of data signals, for example when differential demodulation is performed. However, even in the case of a coherent receiver in which the correction of the carrier frequency is performed during operation by means of a phase locked loop (PLL), further correction of the carrier frequency is required in order to accelerate the initial synchronization of the phase locked loop, or to enable it at all. Use is generally made in these cases of an automatic frequency control (AFC). An essential component of this automatic frequency control is the frequency error detector or, for short, frequency detector, which supplies a measure of the frequency error instantaneously present. The above-mentioned patent describes such a frequency detector. Importance attaches in this case to the so-called pattern jitter freedom, which means that the output sisal of the frequency detector is independent of the transmitted data pattern in the case of a steady-state control loop.

The conditions for the pattern jitter freedom of such a frequency error detector are described in the essay by Alberty and Hespelt "A New Pattern Jitter Free Frequency Error Detector", IEEE COM-37, No. 2, February 1989, pages 159 to 163.

The frequency detector which is described by the above-mentioned patent does permit synchronization even in the case of a very large frequency offset, is economically produced and also achieves the result that the pattern jitter is completely suppressed for any type of multiphase PSK modulation or multiphase quadrature amplitude modulation (M-QAM). However, it does not produce any pattern jitter freedom in the case of offset modulations.

SUMMARY OF THE INVENTION

It is an object of the present invention to specify a frequency detector of above-described-type mentioned at the beginning which completely suppresses the pattern jitter in the case of offset modulations. Furthermore, this frequency detector is to be economical to produce.

These objects and others are attained in a frequency detector for carrier frequency synchronization in a receiver of a digital data transmission, this receiver producing a demodulated received signal including an in-phase component and a quadrature component and including a frequency control circuit including a voltage-controlled oscillator producing a VCO signal, means for producing a product signal consisting of a real part (x) and an imaginary part (y) from the received signal and the VCO signal, means for suppressing signal terms of a double frequency of the product signal; the frequency detector comprising means for inputting the real part (x) and the imaginary part (y) of the product signal; cascades of complex bandpass filters and real or complex pre-equalizers, these cascades including means for bandpass filtering and means for pre-equalizing the real part (x) and the imaginary part (y) of the product signal to form cascade output signals and a logic circuit including means for combining the cascade output signals to form a control signal for the voltage-controlled oscillator, the means for combining including means for one of squaring and multiplying the cascade output signals to form resulting signals as a measure of power and means for subtracting the resulting signals from each other to produce the control signal.

According to the invention at least two cascades, each composed of one of the pre-equalizers and one of the bandpass filters, have center frequencies having different absolute values situated in a frequency range of a single Nyquist edge of the power density spectrum of the demodulated received signal.

In a preferred embodiment of the invention at least two other cascades each consist of a pre-equalizer and a bandpass filter and have center frequencies having different absolute values situated in a frequency range of the other Nyquist edge of the power density spectrum of the demodulated received signal. Furthermore in this embodiment advantageously the cascades include complex pre-equalizers receiving a complex signal part and two cascades for the respective Nyquist edges have center frequencies and frequency passbands located symmetrically relative to a middle frequency between the respective Nyquist edges in an offset range.

In other embodiments of the invention the cascades advantageously have frequency passbands arranged in a raster-like fashion, have gaps therebetween or arranged in sequence without gaps. In some embodiments the cascades can have frequency passbands having equal bandwidths.

Advantageously in another preferred embodiment two cascades each have a passband width of approximately half the single Nyquist edge, $PNyq/2$, and respective center frequencies of $|fm|=|fNyq|\pm BNyq/4$.

In additional preferred embodiments the cascades include complex pre-equalizers receiving a complex signal part and two cascades for respective Nyquist edges have center frequencies and frequency passbands located symmetrically relative to a frequency $f=0$.

The cascades in some embodiments have real pre-equalizers for a real signal part, at least two pairs of said cascades are provided in the frequency detector and individual cascade pairs respectively have different center frequencies while cascades of one cascade pair have equal center frequencies and equal passband widths.

The frequency detector according to the invention permits complete suppression of pattern jitter in the case of offset modulations. It permits synchronization even in the case of a very large frequency offset and is realized in a way involving low outlay.

The basic idea of the invention resides in the realization that pattern jitter freedom can be achieved for offset modulations if at least two cascades of pre-equalizers and bandpass filters are selected with respect to center frequency and passband width in such a way that they evaluate the received signal in a suitable way in the region of only one Nyquist edge. Of course, the received signal can be evaluated in the same way at the other Nyquist edge, with the result that it is possible to achieve an increased sensitivity and thus an increased control efficiency with the addition of the two control signals.

BRIEF DESCRIPTION OF THE DRAWING

The objects, features and advantages of the invention are made more apparent from the preferred embodiments described in the following description, with reference to the accompanying figures in which:

FIG. 1a, 1b, 1c, 1d, 1e, 1f and 1g are graphical illustrations of examples of power density frequency spectra for demodulated received signals;

DESCRIPTION OF THE PREFERRED EMBODIMENTS

Figure 1:
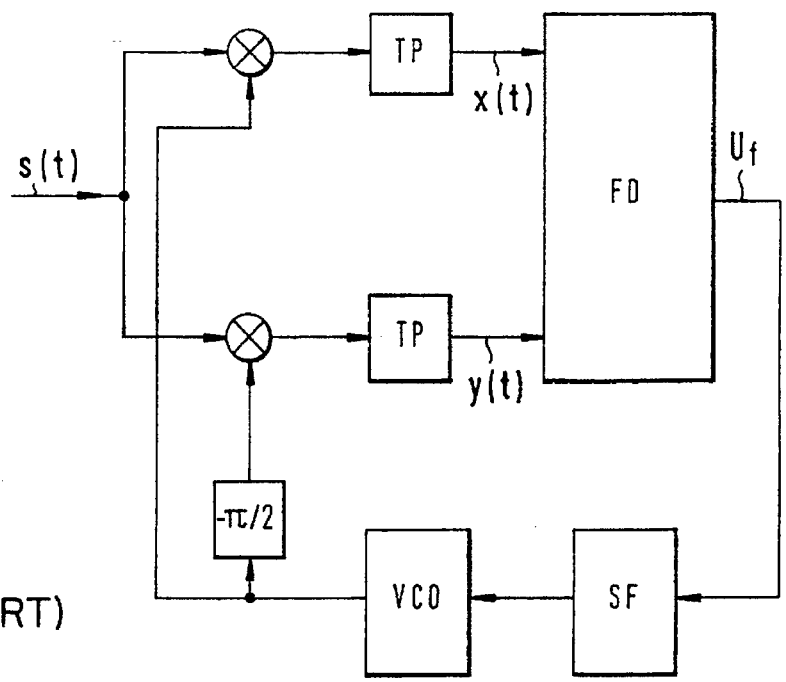
FIG. 1 is a block diagram of a known frequency control circuit including a frequency error detector.

FIG. 1 shows the known principle of an automatic frequency control. The output signal of a voltage-controlled oscillator VCO is multiplied by the input-side received signal s(t), on the one hand directly or on the other hand phase-shifted by $\pi/2$, and filtered via low-pass filters TP, the product components with the sum frequency being suppressed and the filtered signals x(t) and y(t) being input to a frequency detector FD which generates a control voltage $u_f$ for driving the VCO via a loop filter SF. The control voltage $u_f$ is a measure of the frequency offset which is to be controlled to zero by means of this control loop.

Figure 1A:
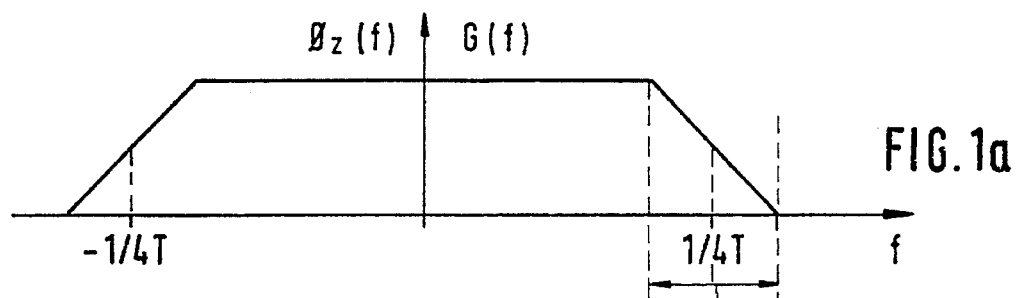
Figure 1B:
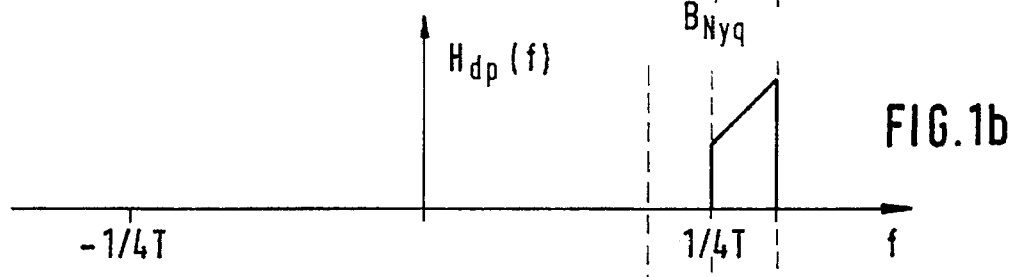
Figure 1C:
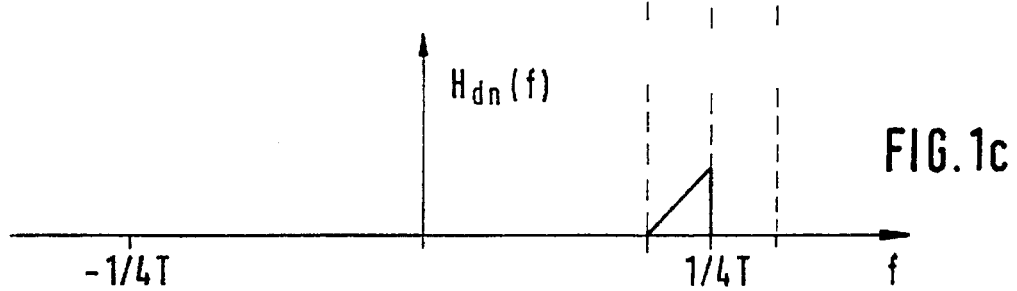

FIG. 1a shows a frequency spectrum, specifically the power density spectrum of the demodulated received signal for a frequency offset of zero. It corresponds to the transmitting filter characteristic G(f). FIGS. 1b and 1c show the spectral situations for an exemplary embodiment of the frequency detector according to the invention and having two cascades on the upper Nyquist edge. The two cascades have a bandwidth of half the edge width of the Nyquist edge $B_{Ny}$, and are arranged symmetrically relative to the Nyquist frequency of $f_{Nyq}=¼$ T. T is the symbol clock pulse length. The transmission characteristic $H_{dp}$ and $H_{dn}$ are, for example, respectively inverse relative to the Nyquist edge and have a damping characteristic, with the result that for a frequency offset of zero the two cascades generate equal output signal amplitudes and thus equal power. The Nyquist frequency value in accordance with FIGS. 1a to 1c is the value usual for the offset modulation QPSK, but of course the frequency detector according to the invention can also be used for normal QPSK modulation or other multiphase QPSK modulations or multistage quadrature amplitude modulations (M-QAM), it being possible to use other values for the Nyquist frequency, for example for normal QPSK $f_{Nyq}=½$ T. Other examples of power spectra are shown in FIGS. 1d to 1g.

Figure 2:
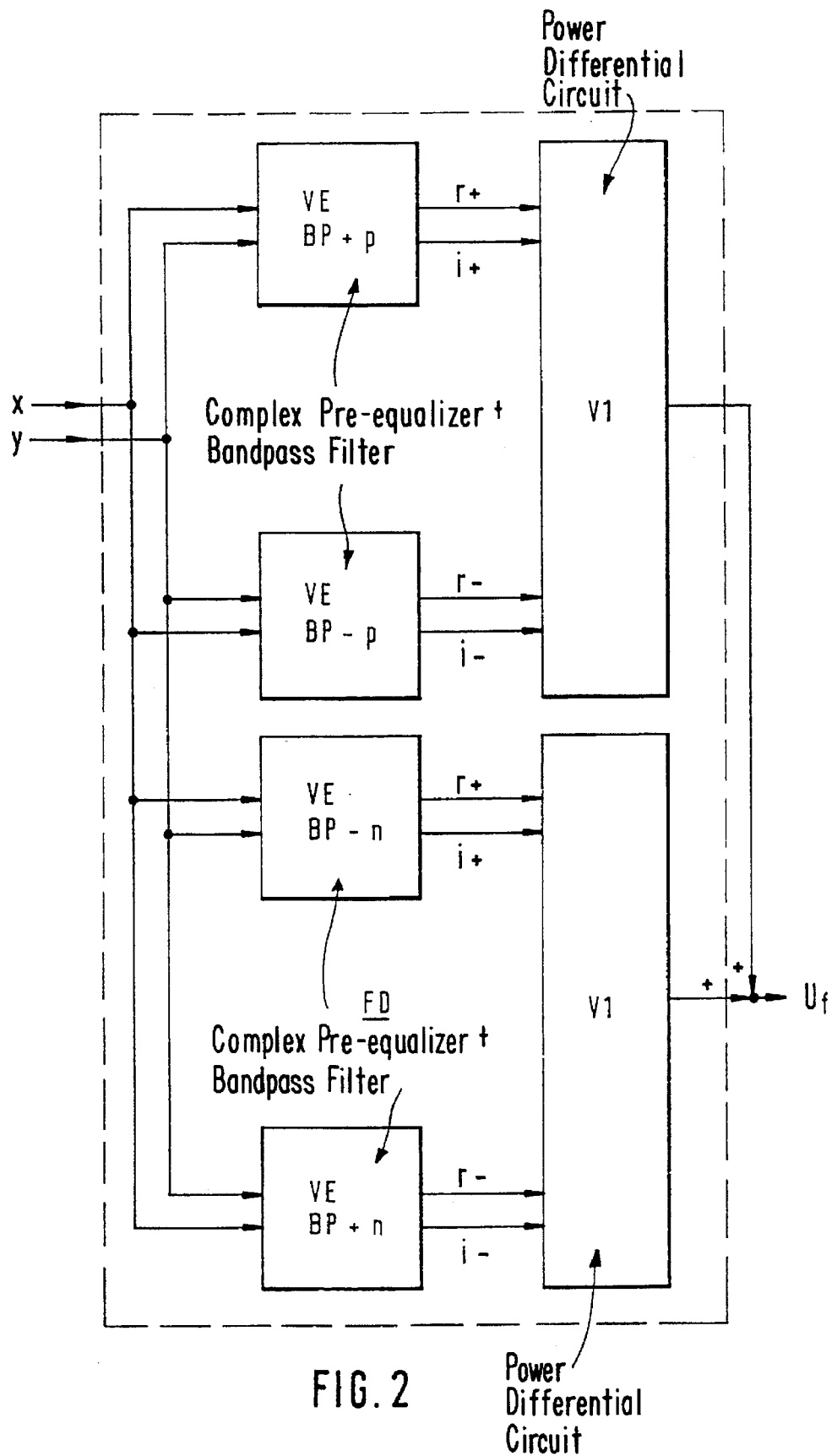
FIGS. 2 and 3 are block diagrams of two embodiments of frequency detectors according to the invention.

FIG. 2 shows a frequency detector according to the invention and having in each case two cascades for each Nyquist edge. Each cascade consists here of the complex pre-equalizers VE and bandpass filters BP. The blocks +P and +N are arranged in accordance with FIGS. 1b and 1c on the upper Nyquist edge, and the blocks −P and −N are arranged in a reflected fashion relative to the zero frequency axis on the lower Nyquist edge. The logic circuits V1 now combine the two output signal pairs +P, −P and +N, −N, respectively, by means of a power differential circuit, that is to say after the squaring of the real and imaginary part, respectively, of each complex output signal of the individual cascades, the total powers of 2 cascades are subtracted from one another.

Figure 3:
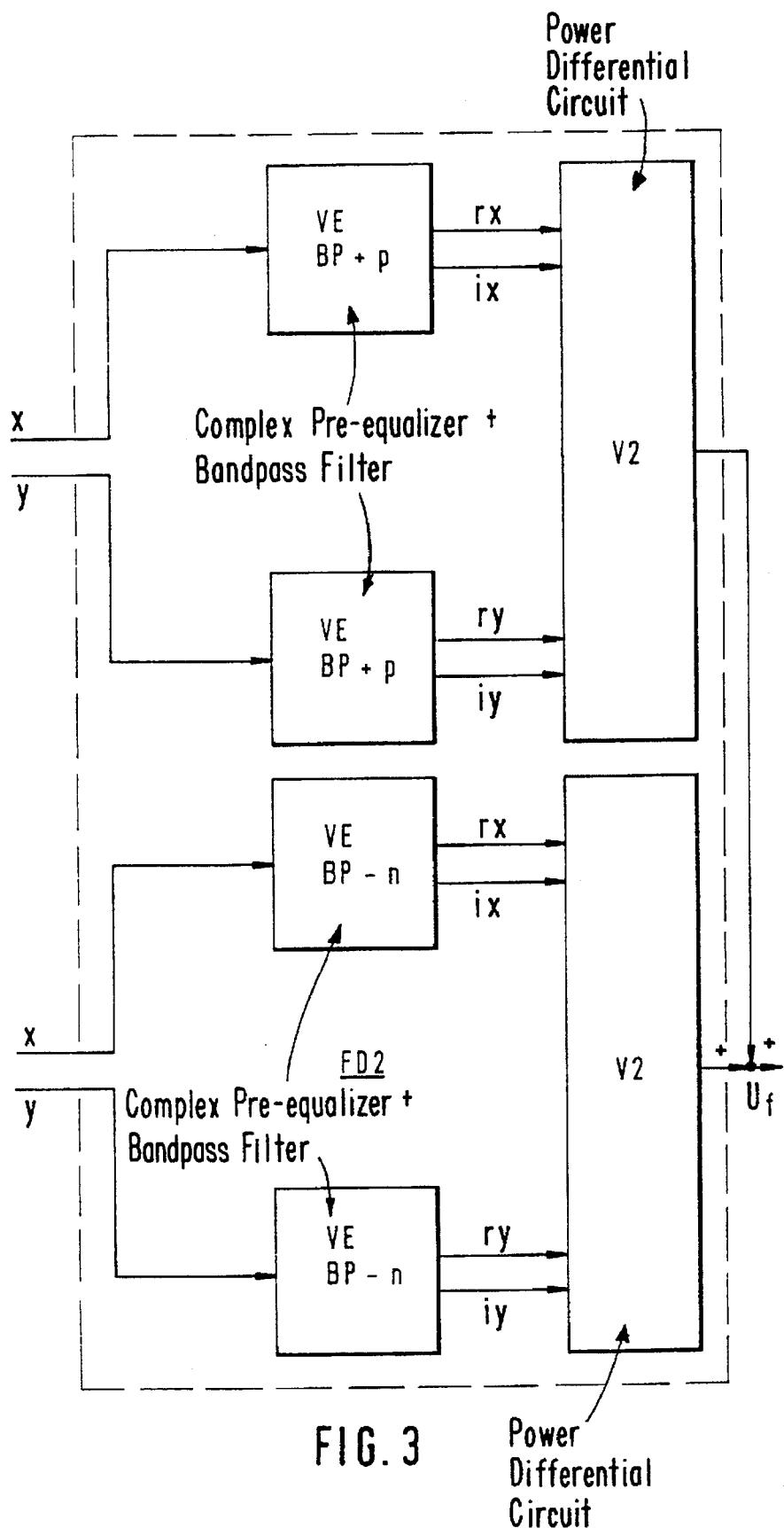
Figure 2A:
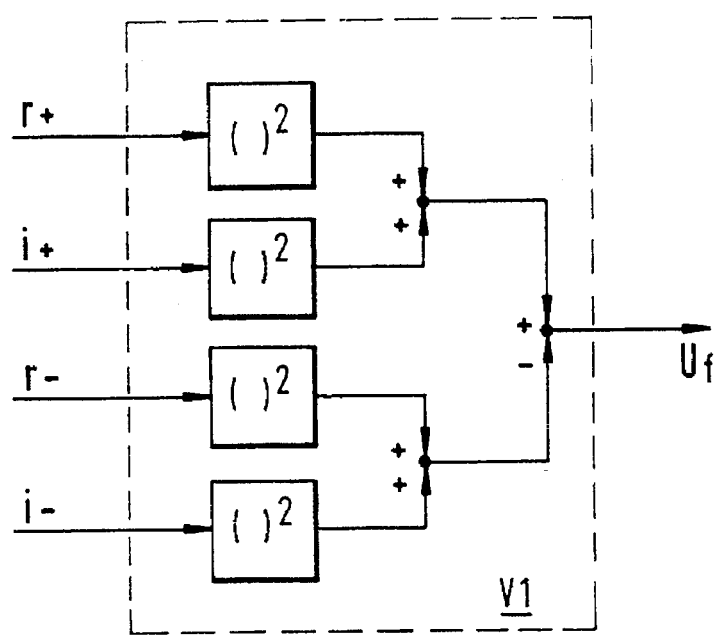
FIGS. 2a and 3a are block diagrams of two embodiments of known logic circuits for the cascade output signals.
Figure 3A:
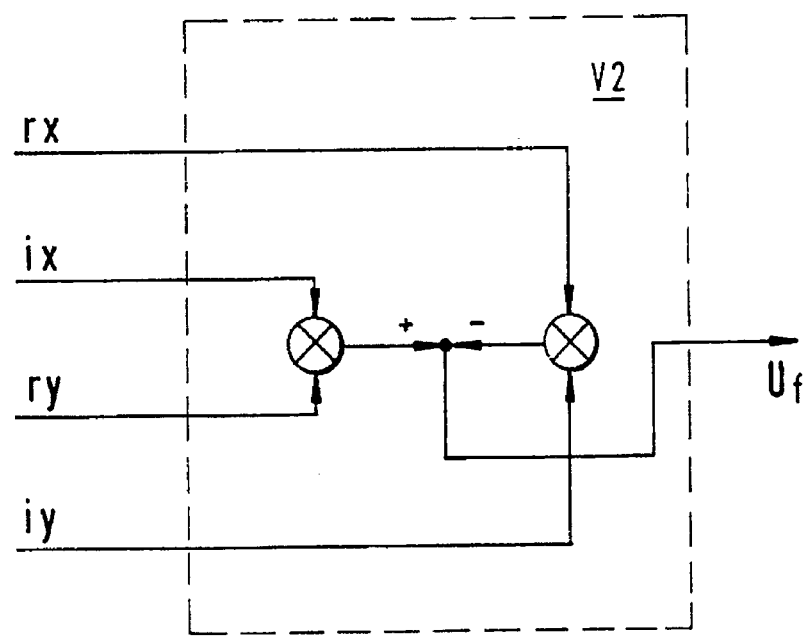

FIG. 2 shows a logic circuit which represents a modified arrangement which does not now quite correspond to the arrangement P or N in accordance with FIGS. 1b and 1c, respectively. Rather, the output signals of the cascades whose passbands are reflected at the zero frequency have been combined with one another here. Proceeding from FIG. 2 and knowing that a real input signal which is fed into the cascades of the real positive Nyquist edge has the same effect as the two components, real part and imaginary part, of a complex input signal fed into the mutually corresponding cascades of the positive and negative Nyquist edges, the result is the simplified arrangement of FIG. 3. That is to say, here the cascades for the negative Nyquist edge are lacking, and the cascade inputs, in other words the pre-equalizers of the remaining cascades at the positive Nyquist frequency, are less complicated by half since the two input filter blocks of the pre-equalizer are respectively eliminated in the individual cascades. The further advantage is that two identical cascades can be realized in each pair. The complex output signals are now combined, in each case by means of a combiner V2, accompanied likewise by the formation of a power differential. This combination is realized in accordance with the relationship uf=ix·ry−rx·iy. It is illustrated as a circuit in FIG. 3a. Complementary to this, FIG. 2a shows the logic circuit V1 as is used, for example, in the case of the frequency detector according to FIGS. 1b and 1c or according to FIG. 2. There, the squaring is carried out with $r^2$ and $i^2$, which is followed by addition of the associated signals which, finally, are subtracted from one another and ultimately form the control signal $u_f$.

I claim:

1. A frequency detector for carrier frequency synchronization in a receiver of a digital data transmission, said receiver producing a demodulated received signal including an in-phase component and a quadrature component and said receiver comprising a frequency control circuit including a voltage-controlled oscillator (VCO) producing a VCO signal, means for producing a product signal from the received signal and the VCO signal, said product signal consisting of a real part (x) and an imaginary part (y), means for suppressing signal terms of a double frequency of said product signal; said frequency detector comprising means for inputting the real part (x) and the imaginary part (y) of said product signal; cascades of complex bandpass filters and real or complex pre-equalizers, said cascades including means (BP) for bandpass filtering and means (VE) for pre-equalizing the real part (x) and the imaginary part (y) of the product signal to form cascade output signals and a logic circuit including means for combining said cascade output signals to form a control signal ($u_f$) for the voltage-controlled oscillator(VCO), said means for combining including means for one of squaring and multiplying the cascade output signals to form resulting signals as a measure of power and means for subtracting the resulting signals from each other to produce said control signal ($u_f$), wherein at least two of said cascades, each composed of one of the pre-equalizers and one of the bandpass filters, have center frequencies having different absolute values situated in a frequency range of a single Nyquist edge of a power density spectrum of said demodulated received signal.

2. The frequency detector as defined in claim 1, wherein at least two others of said cascades each consist of one of said pre-equalizers and one of said bandpass filters and have center frequencies having different absolute values situated in a frequency range of the other Nyquist edge of said power density spectrum of said demodulated received signal.

3. The frequency detector as defined in claim 1, wherein the cascades have frequency passbands arranged in a raster-like fashion.

4. The frequency detector as defined in claim 3, wherein the frequency passbands have gaps therebetween.

5. The frequency detector as defined in claim 1, wherein the cascades have frequency passbands arranged in sequence without gaps.

6. The frequency detector as defined in claim 1, wherein the cascades have frequency passbands having equal bandwidths.

7. A frequency detector for carrier frequency synchronization in a receiver of a digital data transmission, said receiver producing a demodulated received signal including an in-phase component and a quadrature component and said receiver comprising a frequency control circuit including a voltage-controlled oscillator (VCO) producing a VCO signal, means for producing a product signal from the received signal and the VCO signal, said product signal consisting of a real part (x) and an imaginary part (y), means for suppressing signal terms of a double frequency of said product signal; said frequency detector comprising means for inputting the real part (x) and the imaginary part (y) of said product signal; cascades of complex bandpass filters and real or complex pre-equalizers, said cascades including means (BP) for bandpass filtering and means (VE) for pre-equalizing the real part (x) and the imaginary part (y) of the product signal to form cascade output signals and a logic circuit including means for combining said cascade output signals to form a control signal ($u_f$) for the voltage-controlled oscillator(VCO), said means for combining including means for one of squaring and multiplying the cascade output signals to form resulting signals as a measure of power and means for subtracting the resulting signals from each other to produce said control signal ($u_f$), wherein at least two of said cascades, each composed of one of the pre-equalizers and one of the bandpass filters, have center frequencies having different absolute values situated in a frequency range of a single Nyquist edge of a power density spectrum of said demodulated received signal;

wherein two of said cascades each have a passband width of approximately half the single Nyquist edge, PNyq/2, and respective center frequencies of |fm|= |fNyq±BNyq/4.

8. The frequency detector as defined in claim 2, wherein said cascades include said complex pre-equalizers receiving a complex signal part and two of said cascades for respective ones of said Nyquist edges have center frequencies and frequency passbands located symmetrically relative to a frequency f=0.

9. A frequency detector for carrier frequency synchronization in a receiver of a digital data transmission, said receiver producing a demodulated received signal including an in-phase component and a quadrature component and said receiver comprising a frequency control circuit including a voltage-controlled oscillator (VCO) producing a VCO signal, means for producing a product signal from the received signal and the VCO signal, said product signal consisting of a real part (x) and an imaginary part (y), means for suppressing signal terms of a double frequency of said product signal; said frequency detector comprising means for inputting the real part (x) and the imaginary part (y) of said product signal; cascades of complex bandpass filters and real or complex pre-equalizers, said cascades including means (BP) for bandpass filtering and means (VE) for pre-equalizing the real part (x) and the imaginary part (y) of the product signal to form cascade output signals and a logic circuit including means for combining said cascade output signals to form a control signal ($u_f$) for the voltage-controlled oscillator(VCO), said means for combining including means for one of squaring and multiplying the cascade output signals to form resulting signals as a measure of power and means for subtracting the resulting signals from each other to produce said control signal ($u_f$), wherein at least two of said cascades, each composed of one of the pre-equalizers and one of the bandpass filters, have center frequencies having different absolute values situated in a frequency range of a single Nyquist edge of a power density spectrum of said demodulated received signal;

wherein at least two others of said cascades each consist of one of said pre-equalizers and one of said bandpass filters and have center frequencies having different absolute values situated in a frequency range of the other Nyquist edge of said power density spectrum of said demodulated received signal; and wherein said cascades include said complex pre-equalizers receiving a complex signal part and two of said cascades for respective ones of said Nyquist edges have center frequencies and frequency passbands located symmetrically relative to a middle frequency between said respective Nyquist edges in an offset range.

10. A frequency detector for carrier frequency synchronization in a receiver of a digital data transmission, said receiver producing a demodulated received signal including an in-phase component and a quadrature component and said receiver comprising a frequency control circuit including a voltage-controlled oscillator (VCO) producing a VCO signal, means for producing a product signal from the received signal and the VCO signal, said product signal consisting of a real part (x) and an imaginary part (y), means for suppressing signal terms of a double frequency of said product signal; said frequency detector comprising means for inputting the real part (x) and the imaginary part (y) of said product signal; cascades of complex bandpass filters and real or complex pre-equalizers, said cascades including means (BP) for bandpass filtering and means (VE) for pre-equalizing the real part (x) and the imaginary part (y) of the product signal to form cascade output signals and a logic circuit including means for combining said cascade output signals to form a control signal ($u_f$) for the voltage-controlled oscillator (VCO), said means for combining including means for one of squaring and multiplying the cascade output signals to form resulting signals as a measure of power and means for subtracting the resulting signals from each other to produce said control signal ($u_f$), wherein at least two of said cascades, each composed of one of the pre-equalizers and one of the bandpass filters, have center frequencies having different absolute values situated in a frequency range of a single Nyquist edge of a power density spectrum of said demodulated received signal;

wherein said cascades have said real pre-equalizers for a real signal part, at least two pairs of said cascades are provided in the frequency detector and individual ones of said cascade pairs respectively have different center frequencies while said cascades of one of said cascade pairs have equal center frequencies and equal passband widths.

* * * * *